United States Patent [19]

Taniguchi et al.

[11] Patent Number: 5,572,018

[45] Date of Patent: Nov. 5, 1996

[54] METHOD AND APPARATUS TO DETECT ABSOLUTE POSITION USING ENCODER HAVING A COUNTER CLEAR SIGNAL

[75] Inventors: Mitsuyuki Taniguchi; Hiroshi Yamaguchi, both of Oshino-mura; Yukio Toyozawa, Kikuchi-gun; Shunsuke Matsubara, Oshino-mura, all of Japan

[73] Assignee: Fanuc Ltd., Japan

[21] Appl. No.: 381,985

[22] PCT Filed: Jun. 9, 1994

[86] PCT No.: PCT/JP94/00939

§ 371 Date: Feb. 13, 1995

§ 102(e) Date: Feb. 13, 1995

[87] PCT Pub. No.: WO94/29673

PCT Pub. Date: Dec. 22, 1994

[30] Foreign Application Priority Data

Jun. 14, 1993 [JP] Japan ..................................... 5-167527

[51] Int. Cl.$^6$ .................................................... G01D 5/34
[52] U.S. Cl. .................. 250/231.14; 250/231.18; 377/17
[58] Field of Search ................. 250/231.14, 231.16, 250/231.17, 231.18; 341/11, 13, 31; 377/17; 324/207.24; 318/603, 609; 400/322; 369/44.14; 375/362

[56] References Cited

U.S. PATENT DOCUMENTS

| 4,233,592 | 11/1980 | Leichle | 250/231.14 |
| 4,473,313 | 9/1984 | Nakano et al. | 400/322 |
| 4,833,664 | 5/1989 | Shiragami et al. | 369/44.14 |
| 5,063,576 | 11/1991 | Eguchi et al. | 375/362 |

FOREIGN PATENT DOCUMENTS

| 60-107720 | 7/1985 | Japan . |
| 63-269016 | 11/1988 | Japan . |

*Primary Examiner*—Que T. Le
*Attorney, Agent, or Firm*—Staas & Halsey

[57] ABSTRACT

Rotation of a code plate fixed to a shaft of a detecting object is detected for producing a one-rotation signal and an incremental signal corresponding to a division of one revolution into a plurality of equal sections. The incremental signal is counted by a counter, thereby detecting an absolute position using an encoder. The counter is cleared in response to a one-rotation signal arriving first after the encoder starts its detecting operation. The counter continues to count the incremental signal in proportion to rotation of the shaft of the detecting object after its count value is once cleared, without clearing the count value in response to subsequent one-rotation signals. Thus, the counter obtains an absolute distance from a position where the counter received the first one-rotation signal to a present position.

8 Claims, 2 Drawing Sheets

METHOD AND APPARATUS TO DETECT ABSOLUTE POSITION USING ENCODER HAVING A COUNTER CLEAR SIGNAL

BACKGROUND OF THE INVENTION

1. Field of the Invention

The present invention generally relates to an absolute position detecting method using an encoder for detecting a position, such as a rotational position of a motor or a shift position of a table of a machine tool, and an arrangement of an encoder apparatus for executing the above method.

2. Description of the Related Art

An encoder, known as incremental encoder, has a code plate formed with numerous slits equally spaced along a circumferential periphery thereof. For one complete revolution of the code plate, attached to a rotor shaft or the like, the encoder generates a one-rotation signal and a pair of multiple-rectangular pulse signals having a predetermined phase difference therebetween. This kind of incremental encoder generally produces incremental signals on the basis of the above multiple-rectangular pulse signals independently in each of rotational directions. A counter accumulates these incremental signals to obtain a rotational shift amount (i.e. a rotational position) of the rotor in one revolution.

On the other hand, an absolute encoder has a code plate with a multi-channel pattern formed thereon as shown in FIG. 1. Using this code plate, the absolute encoder generates a code signal representing a rotational position. More specifically, as the code plate shown in FIG. 1 comprises eight channels, an eight digit binary code is outputted for expressing an absolute value of position.

In short, compared with an incremental encoder, an absolute encoder is generally complicated not only in the structure of its code plate but in the arrangement of the signal detecting and processing circuit.

SUMMARY OF INVENTION

The object of the present invention is to realize an absolute position detecting method and the arrangement of a related encoder apparatus by incorporating a simplified signal processing means into the signal processing system adopted in a conventional incremental encoder having a relatively simple structure, without providing the absolute encoder having the above-described disadvantage.

In order to accomplish this and other related objects, the present invention provides an absolute position detecting method using an encoder comprising steps in which rotation of a rotary plate fixed to a shaft of a detecting object is detected to produce a one-rotation signal and an incremental signal corresponding to division of one revolution into a plurality of equal sections and the incremental signal is counted by a counter to detect an absolute position. The method includes the steps of clearing a count value of the counter in response to a first one-rotation signal arriving first after the encoder starts a detecting operation; continuing to count up the incremental signal by the counter followed by rotation of the shaft of the detecting object after finishing the clearing step, without clearing the count value of the counter in response to second and succeeding one-rotation signals; and obtaining, based on the count value of the counter, an information on a distance from a position where the counter received the first one-rotation signal to a present position.

In the above absolute value detecting method, it is preferable that the incremental signal corresponding to division of one revolution into the plurality of equal sections is produced based on two different signals which are generated from the rotary plate with a 90° phase difference therebetween, so that the counter can count up or down the count value in accordance with a rotational direction of the rotary plate. Moreover, the one-rotation signal produced from the encoder is transformed into a rectangular wave, and the counter is cleared in response to detection of a building up or a trailing edge of the rectangular wave in accordance with the rotational direction of the encoder.

It is further preferable that the incremental signal generates pulses equivalent to n-th power of 2 per revolution (n; positive integer), and the counter counts the incremental signal by binary count method, thereby producing a binary output whose digits are divided into two groups, one group consisting of lower n digits representing a rotational angle in one revolution and the other group consisting of (n+1)-th and upper digits representing a total rotation number.

On the other hand, the present invention provides an encoder apparatus comprising: a rotary plate fixed to a rotational shaft of a detecting object; a rotational signal producing circuit for detecting signals generated in response to rotation of the rotary plate and for producing, based on the signals detected from the rotary plate, a one-rotation signal of the rotational shaft and an incremental signal corresponding to division of one revolution of the rotational shaft into a plurality of equal sections; a counter clear signal generating circuit for producing a counter clear signal in response to a designated one of one-rotation signals generated by the rotational signal producing circuit, and for prohibiting the counter clear signal from being produced in response to one-rotation signals other than the designated one; and a counter for counting the incremental signal supplied from the rotational signal producing circuit, and for clearing a count value in response to reception of the counter clear signal supplied from the counter clear signal generating circuit.

In the above encoder, it is preferable that the rotary plate supplies the rotational signal producing circuit with two different signals having a 90° phase difference therebetween when the rotary plate is rotating, and the rotational signal producing circuit has a function of producing the incremental signal independently in each of rotational directions on the basis of the two different signals. Moreover, the rotational signal producing circuit transforms the one-rotation signal into a rectangular wave, and the counter clear signal generating circuit generates the counter clear signal in response to detection of a building up or a trailing edge of a rectangular wave corresponding to the designated one-rotation signal.

It is further preferable that the rotational signal producing circuit produces the incremental signal equivalent to n-th power of 2 per revolution of the rotary plate (n; positive integer), and the counter counts the incremental signal by binary count method, thereby producing a binary output whose digits are divided into two groups, one group consisting of lower n digits representing a rotational angle in one revolution and the other group consisting of (n+1)-th and upper digits representing a total rotation number.

DETAILED DESCRIPTION OF THE RELATED ART

Figure 3:
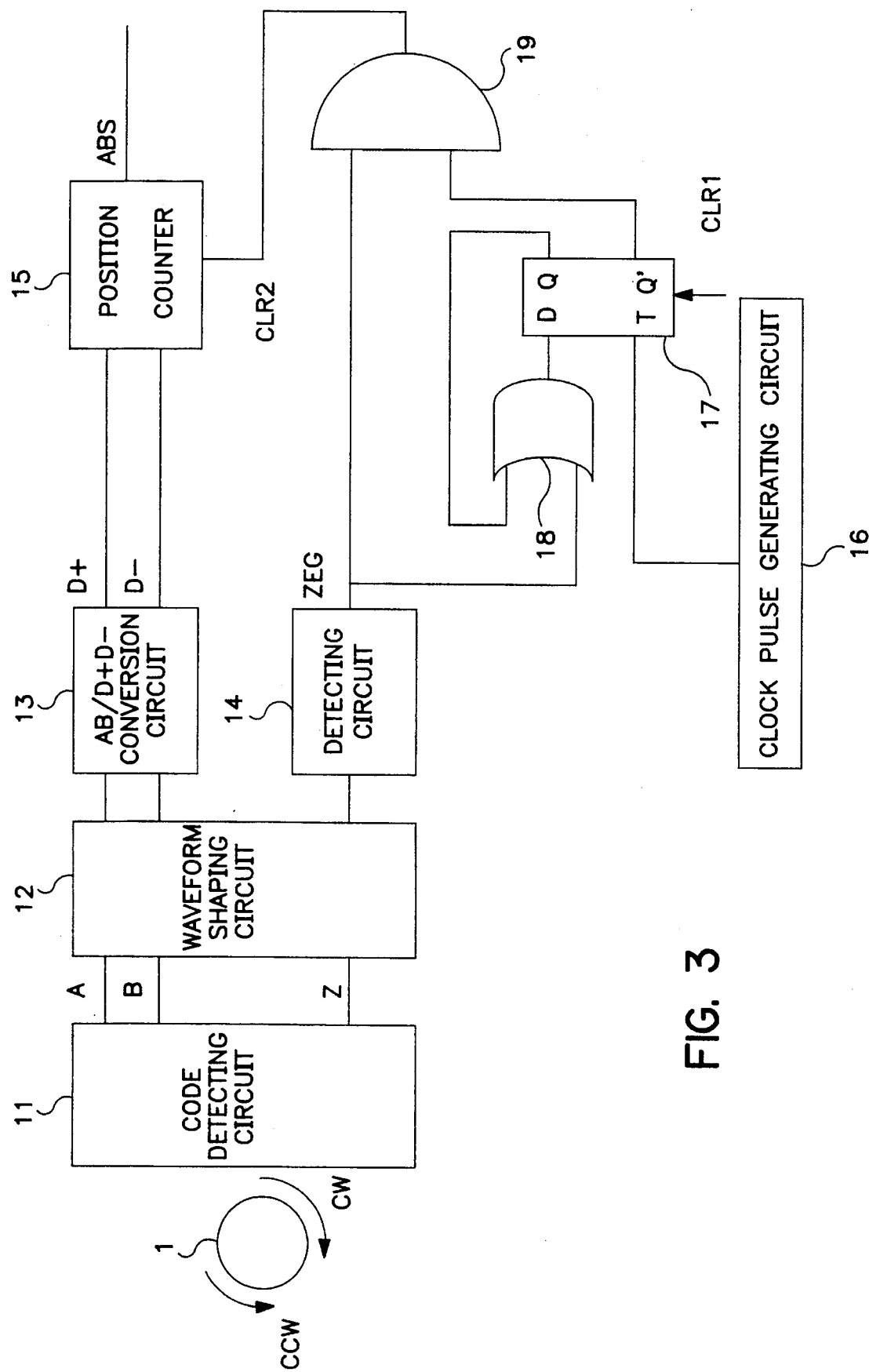
FIG. 3 is a schematic block diagram showing an example of the encoder apparatus including components for realizing an absolute position detecting method of the present invention.

FIG. 3 is a schematic block diagram showing an example of the encoder apparatus for realizing the absolute position detecting method of the present invention.

A sensor section of the encoder apparatus includes a code plate 1, similar to that of an ordinary incremental encoder, which is formed with a code portion for generating a one-rotation signal (i.e. a Z-phase signal), and the other code portion for generating a pair of A-phase and B-phase signals having a 90° phase difference therebetween in one complete revolution. More specifically, the code plate 1 is formed with numerous codes equivalent to $2^{10}=1024$ pulses per revolution to be supplied to a later-described incremental position counter 15 on the basis of the above-described A-phase and B-phase signal when the code plate 1 makes one complete revolution in a clockwise direction or a counterclockwise direction. The code signals, produced in accordance with the rotation of the code plate 1, are detected by the code detecting circuit 11 including an optical or magnetic detecting means. The code detecting circuit 11 transforms the signals obtained from the rotary code plate 1 into A-phase, B-phase and Z-phase signals having a sine waveform for outputting.

A waveform shaping circuit 12 changes each waveform (i.e. sine wave) of the A-phase, B-phase and Z-phase signals (sine wave) obtained from the code detecting circuit 11 into a rectangular pulse waveform. Thus transformed rectangular pulses of A-phase and B-phase are supplied to an AB/D+D− conversion circuit 13 and converted therein into $2^{10}=1024$ pulses per revolution independently in each rotational direction (i.e. the D+ pulse signal when the rotational direction is clockwise, or the D− pulse signal when the rotational direction is counterclockwise). Each of these D+ and D− pulse signals is supplied to the incremental position counter 15. The arrangement of the conversion circuit 13 is an ordinary one which includes a D flip-flop circuit, a clock pulse generator and the like.

The Z-phase signal, transformed into a rectangular wave by the waveform shaping circuit 12, is supplied to a specific side edge detecting circuit 14.

The incremental position counter 15 counts up its count value in response to each of D+ pulse signals supplied from the conversion circuit 13 (corresponding to an incremental signal generated when the rotational direction is clockwise), and counts down the count value in response to each of D− pulse signals supplied from the conversion circuit 13 (corresponding to an incremental signal generated when the rotational direction is counterclockwise). In other words, the incremental position counter 15 accumulates the value of "D+" minus "D−". As explained later, when a clear signal CLR 2 is entered into the incremental position counter 15, the count value stored in the incremental position counter 15 is cleared to zero. Accordingly, the incremental position counter 15 outputs a binary signal ABS representing a shift distance from a specific position corresponding to the time the clear signal CLR 2 is received. That is, the incremental position counter 15 gives the absolute position.

The specific side edge detecting circuit 14 generates one pulse signal ZEG every time it detects a specific side edge (i.e. a building-up edge for the clockwise rotational direction and a trailing edge for the counterclockwise rotational direction) of the Z-phase signal transformed into a rectangular wave by the waveform shaping circuit 12. This pulse signal ZEG is supplied to one input terminal of each of an OR circuit 18 and an AND circuit 19. The other input terminal of the OR circuit 18 is connected to a Q output terminal of a D flip-flop circuit 17 constituting a latch circuit. The other input terminal of the AND circuit 19 is connected to a Q' output terminal of the D flip-flop circuit 17. The D flip-flop circuit has a D input terminal connected to an output terminal of the OR circuit 18, and a T input terminal connected to a clock pulse generating circuit 16.

The clock pulse generating circuit 16 has a function of supplying clock pulses to the T input terminal of the D flip-flop circuit 17, as well as a function of supplying control clock pulses to other components as occasion demands.

Operation of the encoder apparatus having the above arrangement and functions of various components will be explained hereinafter with reference to the time chart shown in FIG. 2. It is assumed that a clear signal CLR 1 is entered into a clear terminal of the flip-flop circuit 17 in response to termination of the preceding operation, and an electric power unit is newly turned on under the condition where Q=0 and Q'=1. (If the clear signal CLR 1 is not entered, it will be adequate that the reset operation is carried out at the time when the electric power unit is turned on.)

In response to the turning on of the electric power unit in this condition (at the time ST), the clock pulse generating circuit 16 starts sending out the clock pulses having a predetermined period to the T input terminal of the D flip-flop circuit 17. When the code plate 1 starts rotating (it is assumed for convenience of explanation that the rotational direction is a clockwise direction (CW)), the A-phase, B-phase and Z-phase sine wave signals are supplied to the waveform shaping circuit 12 where the signals are transformed into rectangular pulses. Both the A-phase and the B-phase rectangular pulse signals are sent to the AB/D+D− conversion circuit 13, which produces the D+ pulse signal (although D− pulse signal is produced when the rotational direction is counterclockwise (CCW)). The D+ pulse signal and the D− pulse signal are entered into the incremental position counter 15 executing an incremental counting operation, so as to accumulate the value "D+" −"D−" therein. The accumulation value of the incremental position counter 15 at this moment is a sum of an initial count value stored in the incremental position counter 15 at the time when the electric power unit is turned on (i.e. at the time ST) and a count value corresponding to a shift amount from the starting position corresponding to the time when the electric power unit is turned on. Thus, the accumulation value is not always identical with the absolute value.

When the first Z-phase signal is sent to the specific side edge detecting circuit 14 after the electric power unit is turned on, a specific side edge EG1 (i.e. a building-up edge in this case) is detected. The pulse signal ZEG, generated from the specific side edge detecting circuit 14, is simultaneously entered into both the OR circuit 18 and the AND circuit 19. As the pulse signal ZEG has a finite width adequately determined, one input terminal of the AND circuit 19 is maintained at "1" level (i.e. a HIGH level) during a period corresponding to that width.

On the other hand, when the pulse signal ZEG is entered into the OR circuit 18, the D input terminal of the D flip-flop circuit 17 is immediately turned to "1" level. Waiting a clock pulse (Cn) newly arriving at the T input terminal, the D flip-flop circuit 17 changes the value of its Q output terminal from "0" to "1" in response to the entry of this clock pulse Cn and, at the same time, changes the value of its Q' output terminal from "1" to "0".

Because of the circuit arrangement that returns the Q output of the D flip-flop circuit 17 to the one input terminal of the OR circuit 18, the output terminals Q and Q' are continuously maintained at the condition that Q=1 and Q'=0 unless the clear signal CRL 1 is entered into the D flip-flop circuit 17.

Figure 1:
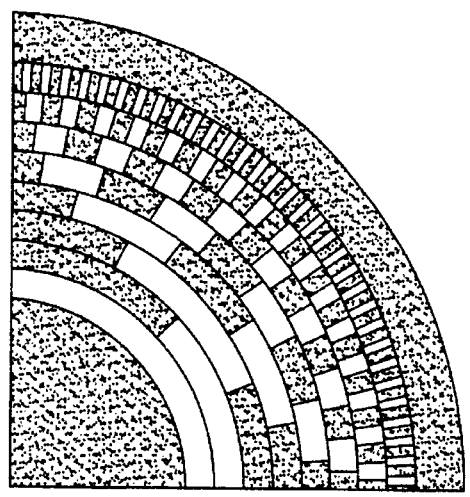
FIG. 1 is a partial plan view showing a conventional example of a multi-channel pattern formed on a code plate of an absolute encoder.
Figure 2:
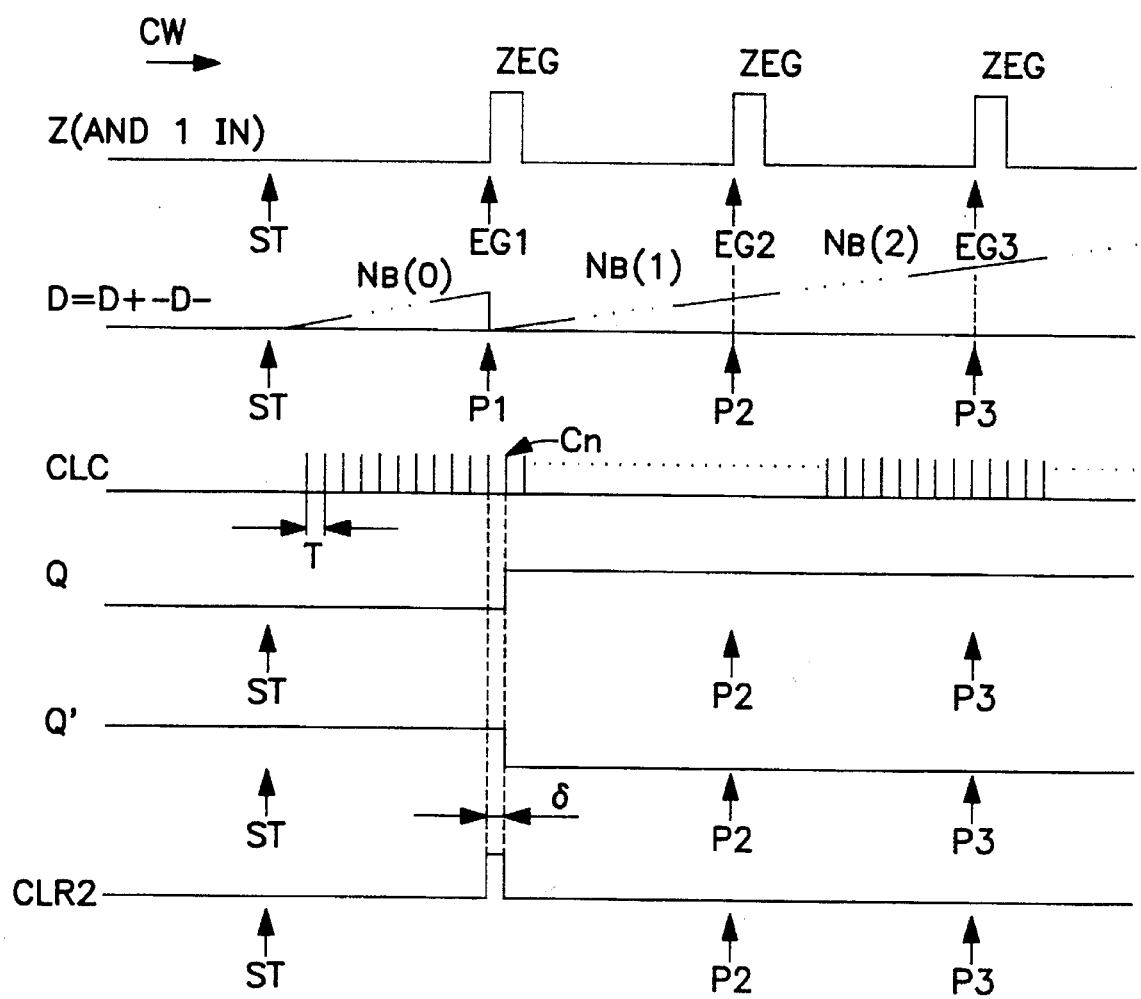
FIG. 2 is a time chart illustrating operations of various portions of an encoder apparatus in accordance with the present invention.

After all, as shown in the time chart of FIG. 2, the values of the output terminals Q and Q' of the D flip-flop circuit 17 change from the condition that Q=0 and Q'=1 to the condition that Q=1 and Q'=0 with a tiny finite delay time δ after the ZEG signal is sent to the OR circuit 18 and the AND circuit 19.

Therefore, an output of the AND circuit 19 is momentarily in a "1" level at the time when the ZEG signal is first entered, because one input of the AND circuit 19 is ZEG signal of "1" level and the other input is Q' output of the D flip-flop circuit 17 being still in a non-inverted condition (i.e. in a "1" condition). Then, after the tiny delay time δ has elapsed, the output Q' of the D flip-flop circuit 17 is turned to "0" condition. Thus, the output CLR 2 of the AND circuit 19 is immediately returned to "0".

At the moment the incremental position counter 15 receives the clear signal CLR 2, the count value of the incremental position counter 15 is immediately cleared to "0" from a count value NB (0) counted up (or down) since the electric power unit is turned on. And, immediately after that, the incremental position counter 15 newly resumes its incremental counting operation. From this time, an output ABS of the incremental position counter 15 is accurately representative of absolute position from the origin which corresponds to a first specific side edge detecting time (P1).

When the encoder further rotates in the same direction, a second specific side edge EG 2 of the Z-phase signal is detected by the specific edge side detecting circuit 14. Thus, the ZEG signal is again entered into both the OR circuit 18 and the AND circuit 19. In response to this ZEG signal, the one input terminal of the AND circuit 19 is again turned to the "1" condition. However, both Q and Q' outputs of the D flip-flop circuit 17 have been maintained (latched) at the condition that Q=1 and Q'=0 since the previous one-rotation signal was detected. This latched condition will not be changed even if the second ZEG signal is entered into the OR circuit 18; therefore, the other input of the AND circuit 19 is maintained at the "0" level. Accordingly, the clear signal CRL 2 is not sent to the incremental position counter 15.

The same operation as the second one-rotation signal is repeated in response to each of third, fourth, fifth,—one-rotation signals successively detected thereafter. In short, the incremental position counter 15 is no longer cleared in response to each input of one-rotation signal, and accordingly can continuously generate a binary signal ABS accurately representing the absolute position from the origin corresponding to the position it receives the first one-rotational signal.

A sequence of signal processing in accordance with the present invention will be explained with reference to the time chart of FIG. 2. Although the following explanation assumes that the code plate starts rotating in the clockwise direction (CW), it should be understood that the same explanation could basically be applied to a code plate rotating in the counterclockwise direction (CCW).

[1] From Turning-on of Electric Power Unit to Detection of First One-rotation Signal (i.e. Z-phase Signal)

For an encoder having an incremental counting mechanism for detecting the position within one complete revolution, an absolute position cannot be known at the time the electric power is just turned on (the time ST in FIG. 2). This is simply because such an operation that designates a position corresponding to turning-on of the electric power unit as an origin of the absolute position is not executed for the incremental position counter 15. Thus, the count value of the incremental position counter 15 is successively incremented in proportion to rotation of the code plate 1 after the electric power unit is turned on. However, the accumulated count value is not at all identical with a distance from the designated position, i.e. the absolute position.

[2] Detection of First Z-phase Signal

As soon as the specific side edge EG 1 of the first Z-phase signal is detected, the count value of the incremental counter 15 is cleared in response to this detection (P1). The detection of the absolute position is thus started from this time.

[3] Detection of Second and Succeeding Z-phase Signals

At the time when each of the specific side edges EG2, EG3—of the second and succeeding Z-phase signals is detected, the incremental position counter is no longer cleared. Accordingly, the accumulation value of the incremental position counter 15 continuously increases as shown in FIG. 2 after the time P1 in proportion to the continuous rotation of the code plate 1.

In addition to the above-described sequence of signal processing according to the present invention, next explained is a merit of constituting an encoder in which its incremental position counter 15 has an incremental count value of n-th power of 2 (n; positive integer) per revolution.

Under the assumption that the incremental count value of the incremental position counter is n-th power of 2 per revolution, the count value N(i) of the incremental position counter at the time when a Z-phase signal in the i-th rotation is detected (the first Z-phase signal detection is regarded as one in the 0-th rotation) is expressed by the following equation.

$$N(i)=i\times 2^n$$

For example, entering n=10 into the above equation obtains N(1)=1024, N(2)=2048, N(3)=3072—, and N(i)=i× 1024.

The above numerals can be expressed by the following equations, each representing a binary notation NB using a total of 20 digits separated into two groups of 10 digits.

| | |
|---|---|
| NB ( 1) = | 0000000001 0000000000 |
| NB ( 2) = | 0000000010 0000000000 |
| NB ( 3) = | 0000000011 0000000000 |
| NB ( 4) = | 0000000100 0000000000 |
| NB (1022) = | 1111111110 0000000000 |
| NB (1023) = | 1111111111 0000000000 |

As understood from the above examples, when the counting operation is carried out based on an ordinary binary count method using n-th power of 2 (n; positive integer) designated as the incremental count value per revolution of the incremental position counter, one group of the lower n digits can be used for representing an absolute position corresponding a rotational angle in one revolution while the other group of the (n+1)-th and the upper digits can be used for representing an absolute position corresponding to a total rotation number. According to such a counting method, it becomes possible to completely separate the digits expressed by the binary notation into two groups; one representing the absolute position corresponding a rotational angle in one revolution and the other representing the absolute position corresponding to a total rotation number. Thus, the position signals can be transmitted by elapsed time pulse signals, and the position signals thus transmitted can be utilized in various ways.

Thus, the code plate 1 of FIG. 3 is formed with numerous codes equivalent to $2^{10}=1024$ pulses per revolution to be supplied to the incremental position counter 15 as D+ pulses or D− pulses. As described above, the binary output ABS of the incremental position counter can express the absolute position corresponding to a rotational angle in one revolution by a group of lower 10 digits and the absolute position corresponding to a total rotation number by a group of 11th and the upper digits. The binary signal whose digits are clearly separated into two groups, one being assigned to the absolute position corresponding to a rotational angle in one revolution and the other being assigned to the absolute position corresponding to a total rotation number, is not only easily transmitted by the elapsed time pulse train but very suitable for handling it in the digital servo circuit utilizing the absolute position detecting signal of an encoder apparatus.

As explained in the foregoing description, the present invention can realize an accurate detection of the absolute position of an encoder without using an absolute type encoder which requires a code plate having a complicated arrangement and a highly technological signal processing circuit.

In other words, the present invention basically utilizes a simplified signal processing in addition to the signal processing adopted in a conventional incremental encoder having a relatively simple structure, thereby always enabling detection of the absolute position including multiple turns.

Furthermore, the encoder apparatus of the present invention can obtain the absolute position exceeding one complete revolution by solely adding a simplified circuit arrangement to a conventional incremental encoder. Thus, compared with a conventional absolute encoder apparatus having a complicated arrangement, a measuring error is reduced and an economical advantage is increased. Moreover, its simplified arrangement brings a merit in assembling or incorporating it into a control system such as a machine tool and a robot.

Yet further, the output of the incremental position counter is a binary output whose digits are clearly separated into two groups; one group representing an absolute position corresponding to a rotational angle in one revolution and the other group representing an absolute position corresponding to a total rotation number. Thus, it brings an advantage in the handling such as transmission of the position signals by the elapsed time pulse signals.

We claim:

1. An absolute position detecting method using an encoder having a rotary plate fixed to a shaft of an object, using a detecting device to detect a rotation of said rotary plate and in response thereto to produce a one-rotation signal and an incremental signal corresponding to a division of one revolution of said rotary plate into a plurality of equal sections and using a counter to count said incremental signal to detect an absolute position of said object, comprising the steps of:

clearing a count value of said counter only in response to a first said one-rotation signal inputted to said counter after said encoder starts a detecting operation;

after said count value in said counter is cleared at said clearing step, continuously counting said incremental signal by said counter in response to a rotation of the shaft of the object; and determining a moving distance between an origin position corresponding to when said counter received the first one-rotation signal and a present position corresponding to a present count value of said counter, said moving distance representing an absolute position of said object from said origin position.

2. The absolute value detecting method in accordance with claim 1, wherein said incremental signal corresponding to the division of one revolution into the plurality of equal sections is produced based on two different signals which are generated from said rotary plate with a 90° phase difference therebetween, so that said counter increases or decreases the count value in accordance with a rotational direction of said rotary plate.

3. The absolute value detecting method in accordance with claim 1, wherein said one-rotation signal produced from the encoder is transformed into a rectangular wave, and said counter is cleared in response to detection of a building up or a trailing edge of said rectangular wave in accordance with the rotational direction of said encoder.

4. The absolute value detecting method in accordance with claim 1, wherein said incremental signal generates pulses equivalent to an n-th power of 2 per revolution (n is a positive integer), and said counter counts said incremental signal by a binary count method, thereby producing a binary output whose digits are divided into two groups, with one group including lower n digits representing a rotational angle in one revolution and the other group including (n+1)-th and upper digits representing a total rotation number.

5. An encoder apparatus comprising:

a rotary plate fixed to a rotational shaft of an object;

a rotational signal detecting circuit for detecting a rotation of said rotary plate and in response thereto, for producing a one-rotation signal and an incremental signal corresponding to a division of one revolution of said rotary plate into a plurality of equal sections;

a counter clear signal generating circuit for generating a counter clear signal only in response to a first said one-rotation signal generated by said rotational signal detecting circuit, and for prohibiting said counter clear signal from being generated in response to a subsequent said one-rotation signal; and a counter for clearing a count value in response to said counter clear signal, thereafter for continuously counting said incremental signal supplied from said rotational signal detecting circuit and for generating data indicative of an absolute distance from an origin position corresponding to said counter receiving said counter clear signal to a present position corresponding to a present count value of said counter.

6. The encoder in accordance with claim 5, wherein said rotary plate supplies said rotational signal detecting circuit with two different signal having a 90° phase difference therebetween when said rotary plate is rotating, and said rotational signal detecting circuit has a function of producing said incremental signal independently in each of rotational directions on the basis of said two different signals.

7. The encoder in accordance with claim 5, wherein said rotational signal detecting circuit transforms said one-rotation signal into a rectangular wave, and said counter clear signal generating circuit generates the counter clear signal in response to detection of a building up or a trailing edge of a rectangular wave corresponding to said first one-rotation signal.

8. The encoder in accordance with claim 5, wherein said rotational signal detecting circuit produces the incremental signal equivalent to an n-th power of 2 per revolution of said rotary plate (n is a positive integer), and said counter counts said incremental signal by binary count method, thereby producing a binary output whose digits are divided into two groups, with one group including lower n digits representing a rotational angle in one revolution and the other group including (n+1)-th and upper digits representing a total rotation number.

* * * * *